United States Patent [19]

Sasaki

[11] Patent Number: 5,627,099
[45] Date of Patent: May 6, 1997

[54] METHOD OF MANUFACTURING SEMICONDUCTOR DEVICE

[75] Inventor: Yoshitaka Sasaki, Tsukuba, Japan

[73] Assignee: LSI Logic Japan Semiconductor, Inc., Tsukuba, Japan

[21] Appl. No.: 351,516

[22] Filed: Dec. 7, 1994

[51] Int. Cl.$^6$ .................................................. H01L 21/76
[52] U.S. Cl. .................. 438/448; 438/911; 438/228; 438/452
[58] Field of Search ........................... 437/69, 70, 72, 437/73

[56] References Cited

U.S. PATENT DOCUMENTS

| | | | |
|---|---|---|---|
| 4,407,696 | 10/1983 | Han et al. | 437/70 |
| 5,093,277 | 3/1992 | Arima et al. | 437/69 |
| 5,196,367 | 3/1993 | Lu et al. | 437/70 |
| 5,338,750 | 8/1994 | Tuan et al. | 437/69 |
| 5,358,893 | 10/1994 | Yang et al. | 437/69 |
| 5,397,732 | 3/1995 | Chen | 437/69 |

FOREIGN PATENT DOCUMENTS 0074764  3/1993  Japan.

OTHER PUBLICATIONS

Sung et al., "The Impact of Poly–Removal Techniques on Thin Thermal Oxide property in Poly–Buffer LOCOS Technology" IEEE Transaction on Electron Devices, vol. 38, No. 8, Aug. 1991, pp. 1970–1973.

M. Ghezzo, et al, "Laterally Sealed LOCOS Isolation", Journal of the Electrochemical Society, Soliid–State Science and Technology, Jun. 1987, pp. 1475–1479.

Primary Examiner—Trung Dang
Attorney, Agent, or Firm—Watson Cole Stevens Davis, P.L.L.C.

[57] ABSTRACT

In a method of manufacturing a semiconductor device, after forming a poly silicon film 54 on a surface of a silicon substrate 51, a silicon nitride film 55 is formed in accordance with a desired pattern and a local oxidation process is carried out to form a field oxide film 56 having a large thickness. Then, after removing the silicon nitride film 55, the poly silicon film 54 is fully converted in to a silicon oxide film 58 and then the thus converted silicon oxide film is removed by wet etching to expose a clean surface of the silicon substrate 51. The poly silicon film does not constitute an oxygen source, so that during the local oxidation, a lateral diffusion of oxygen is prevented and a generation of bird's beak can be suppressed. Further, the poly silicon film serves as a buffer, no stress remains in the surface of the silicon substrate.

4 Claims, 17 Drawing Sheets

FIG._1d
PRIOR ART
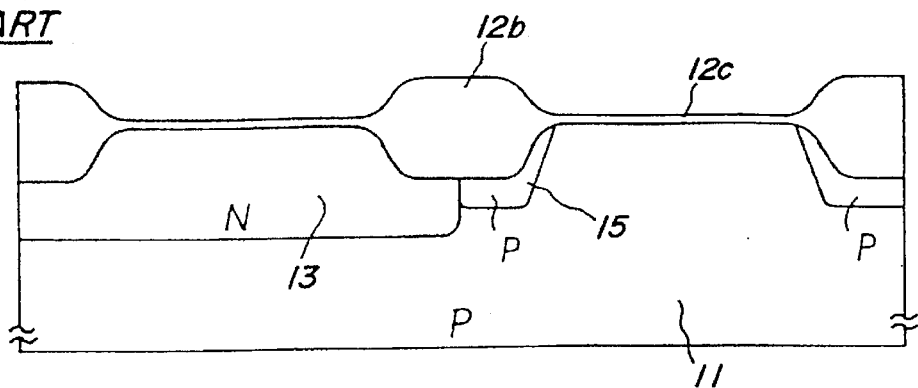
FIG._1e
PRIOR ART
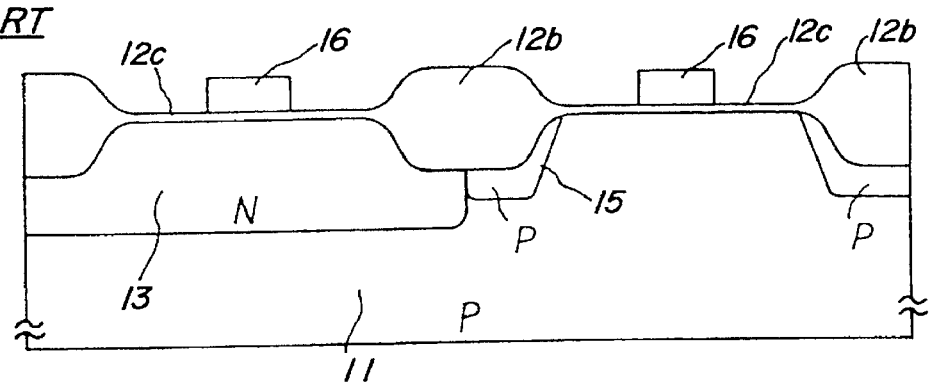
FIG._1f
PRIOR ART
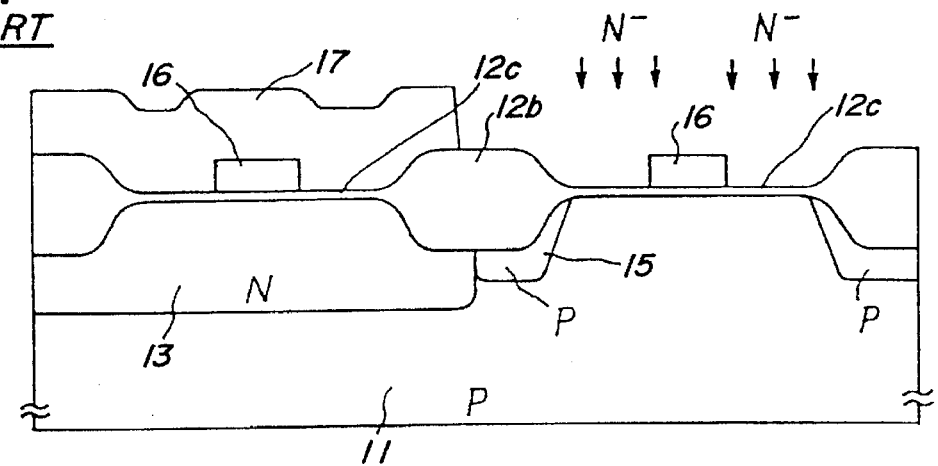

FIG_1g
PRIOR ART
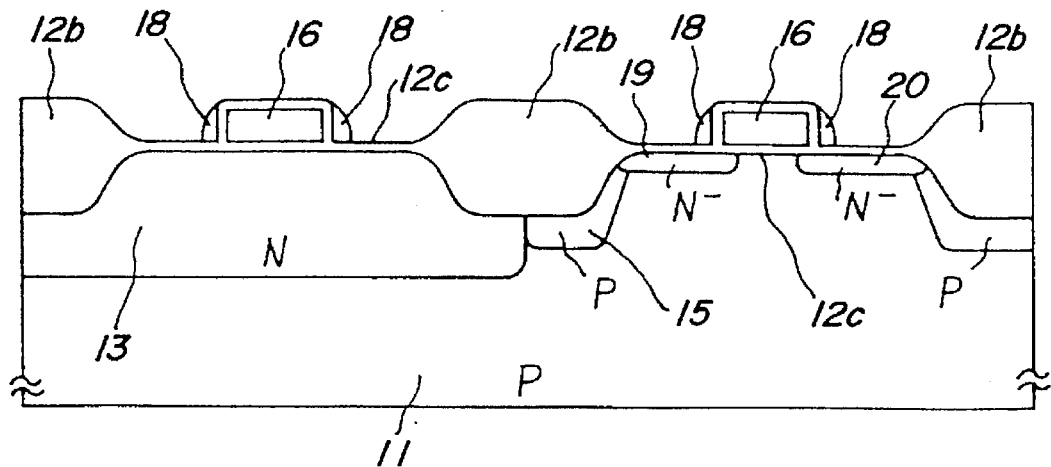
FIG_1h
PRIOR ART
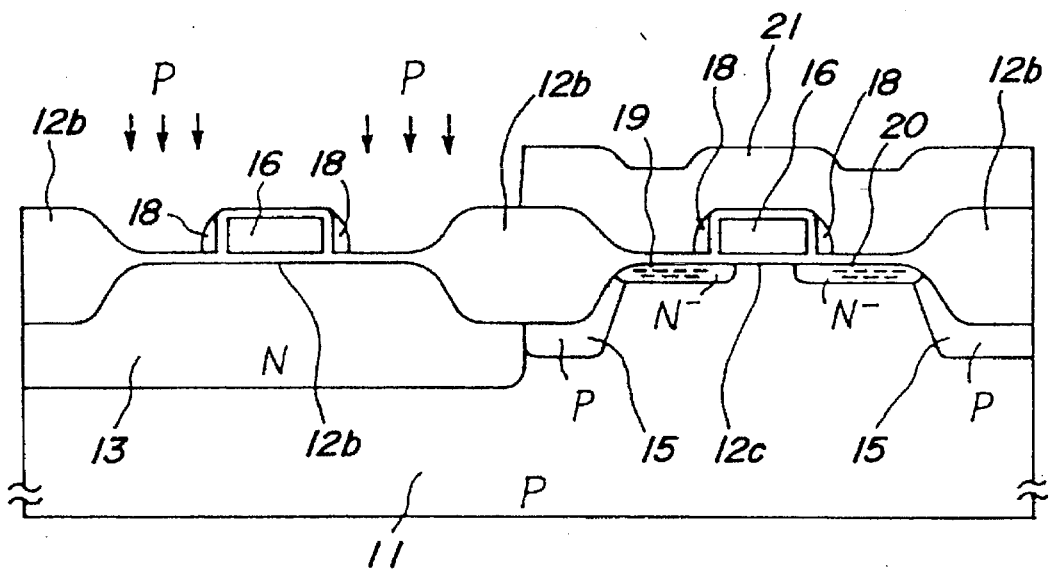

FIG_1i
PRIOR ART
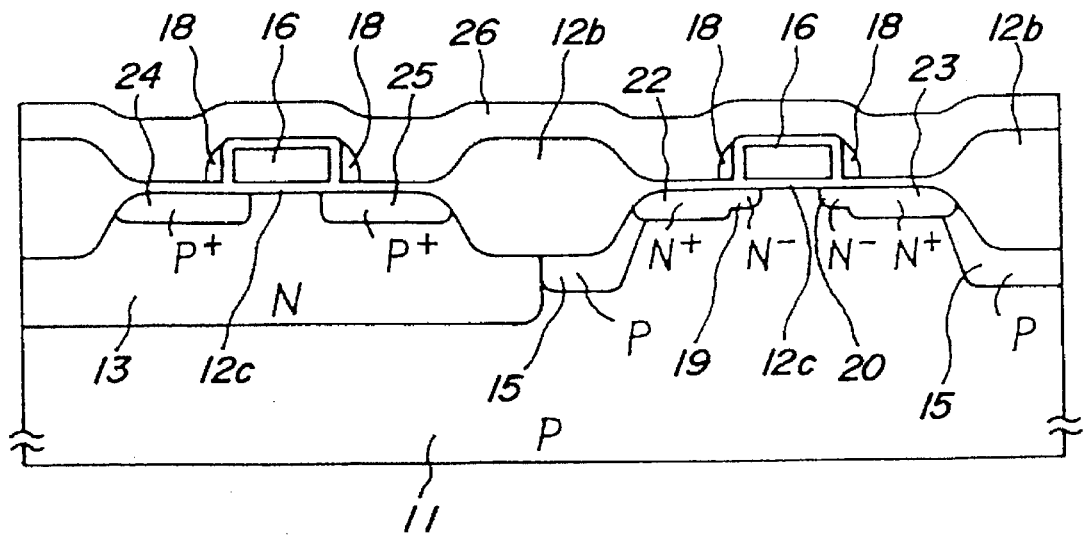
FIG_1j
PRIOR ART
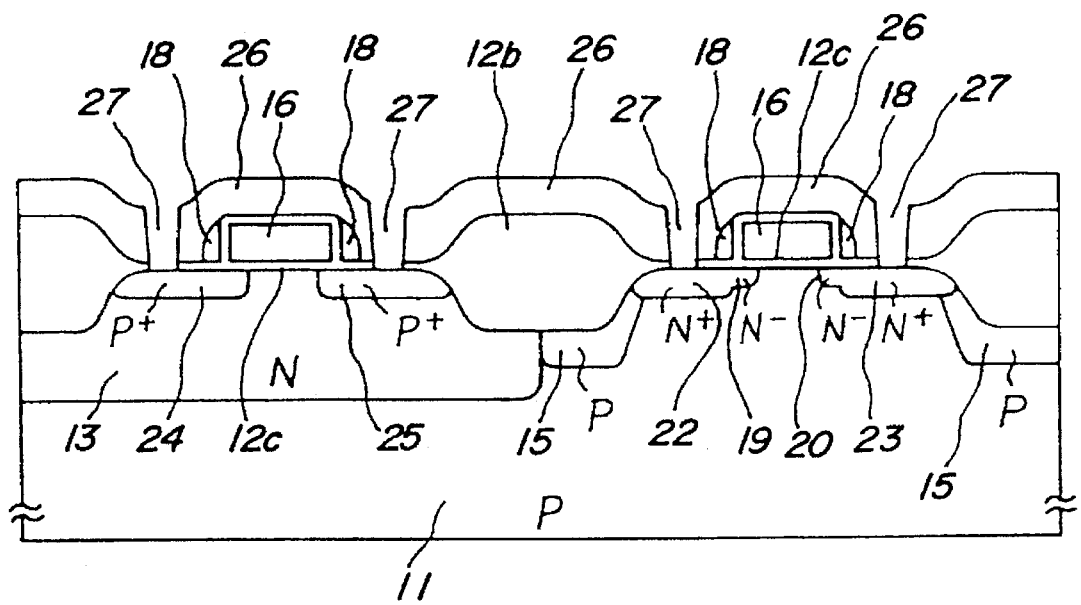

FIG_1k
PRIOR ART
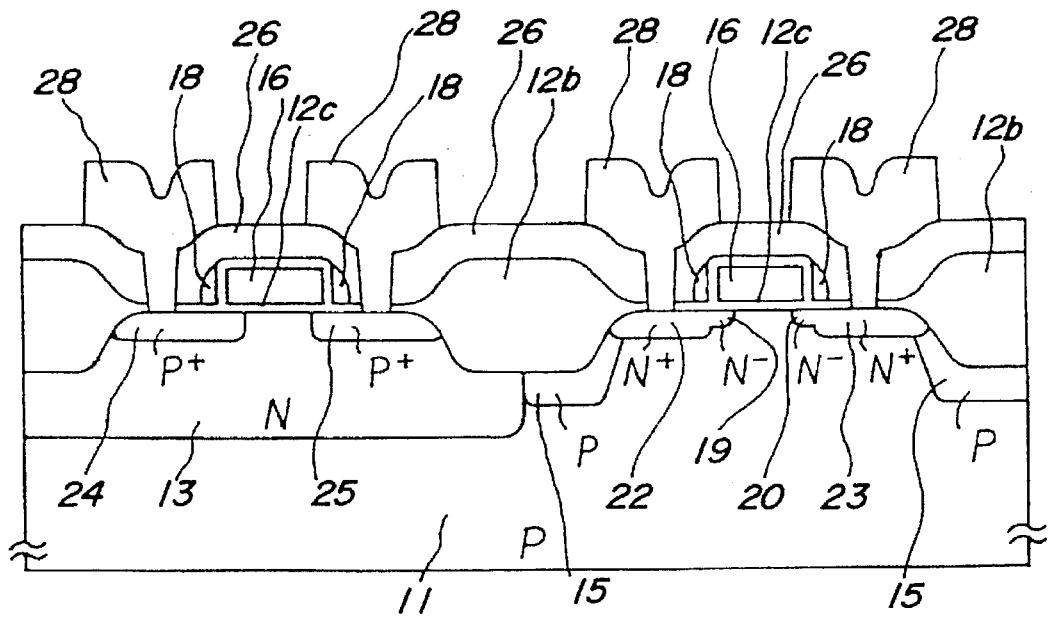
FIG_1ℓ
PRIOR ART
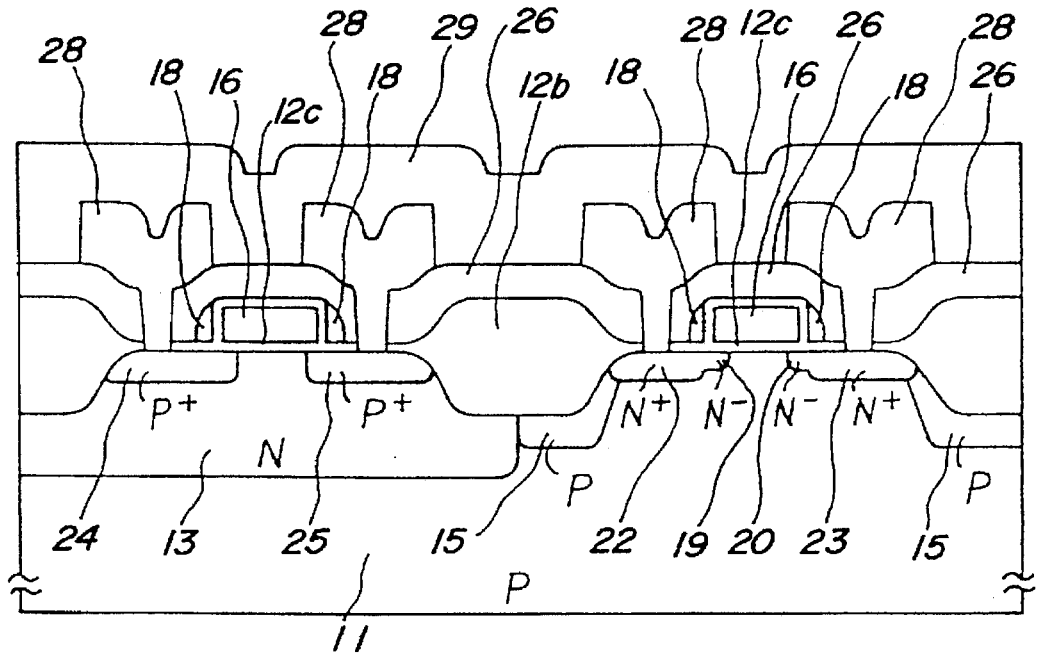

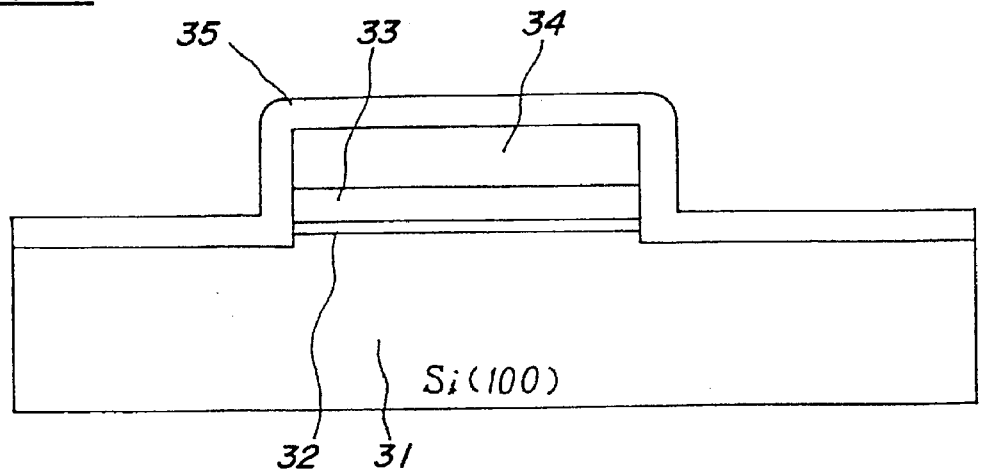
FIG_2a
PRIOR ART
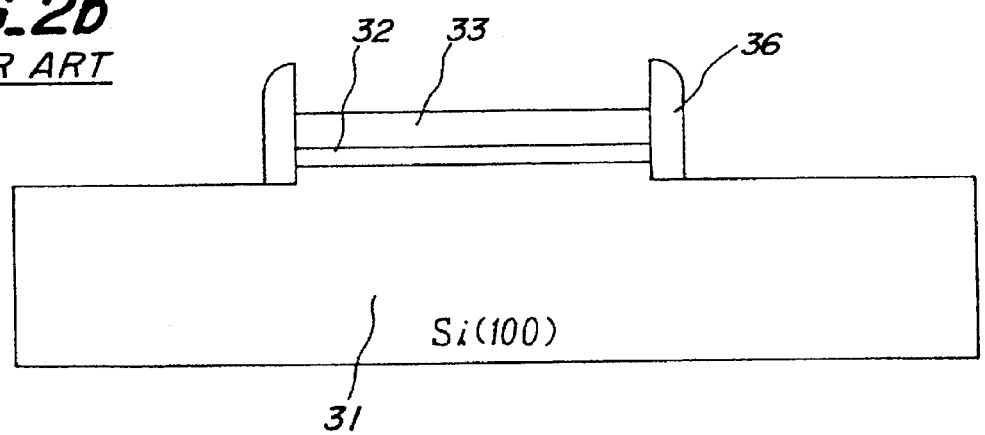
FIG_2b
PRIOR ART
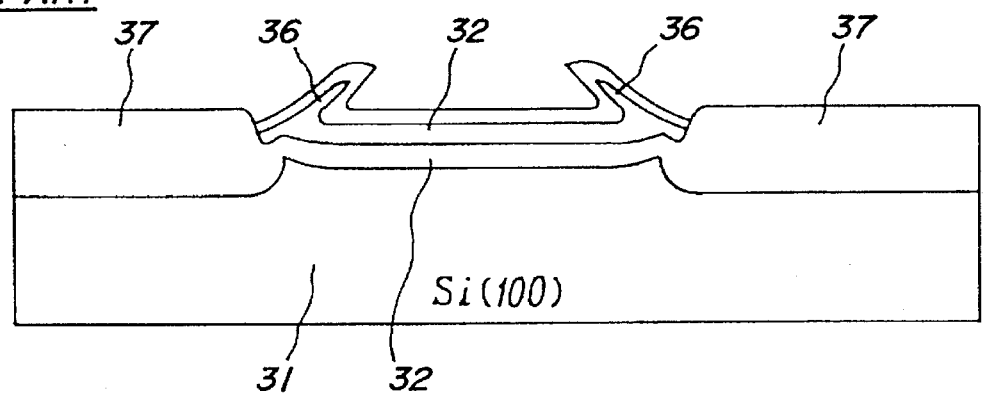
FIG_2c
PRIOR ART

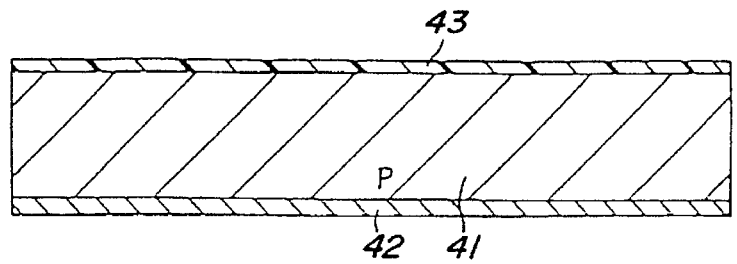
FIG_3a
PRIOR ART
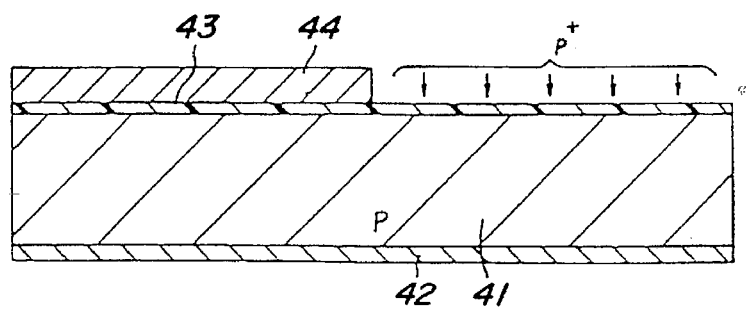
FIG_3b
PRIOR ART
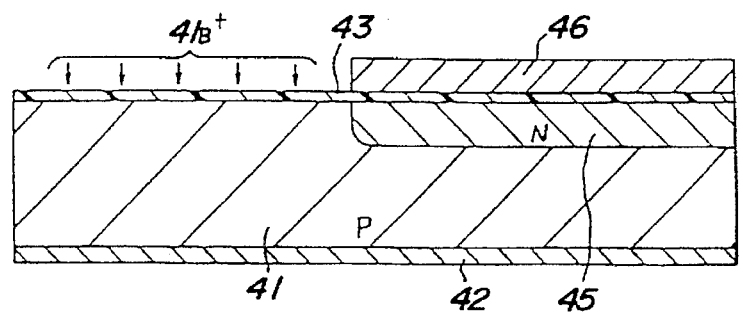
FIG_3c
PRIOR ART
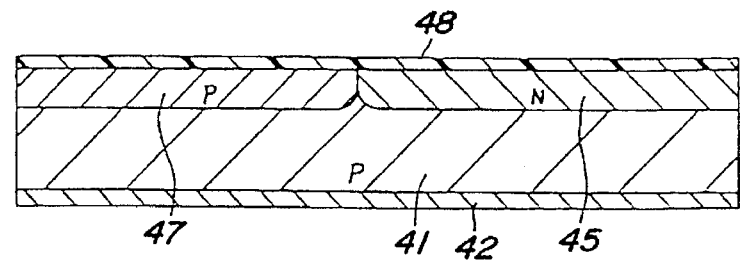
FIG_3d
PRIOR ART

FIG_4a
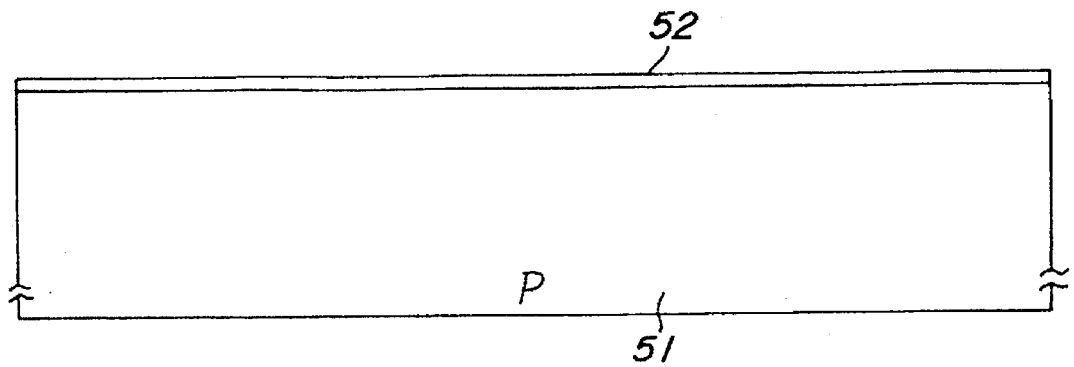
FIG_4b
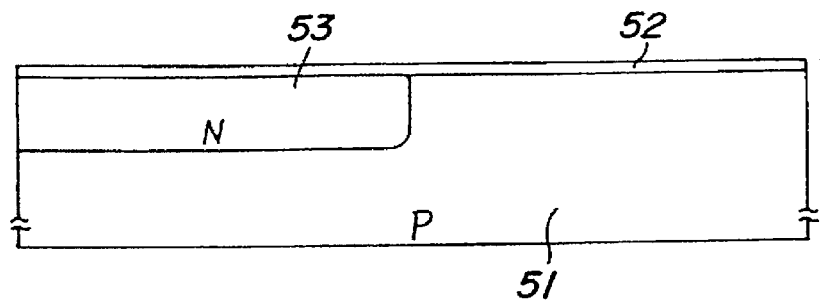
FIG_4c
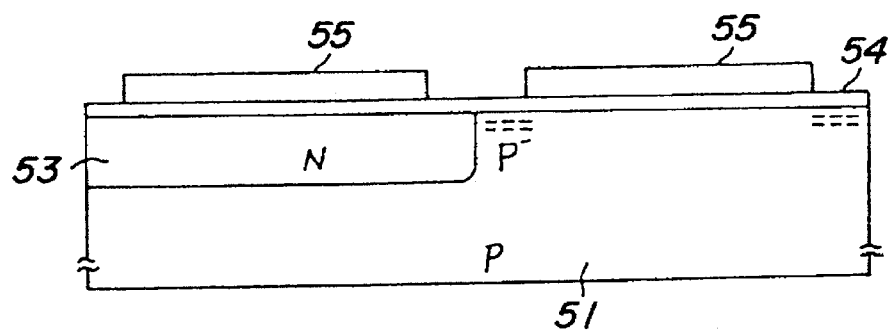

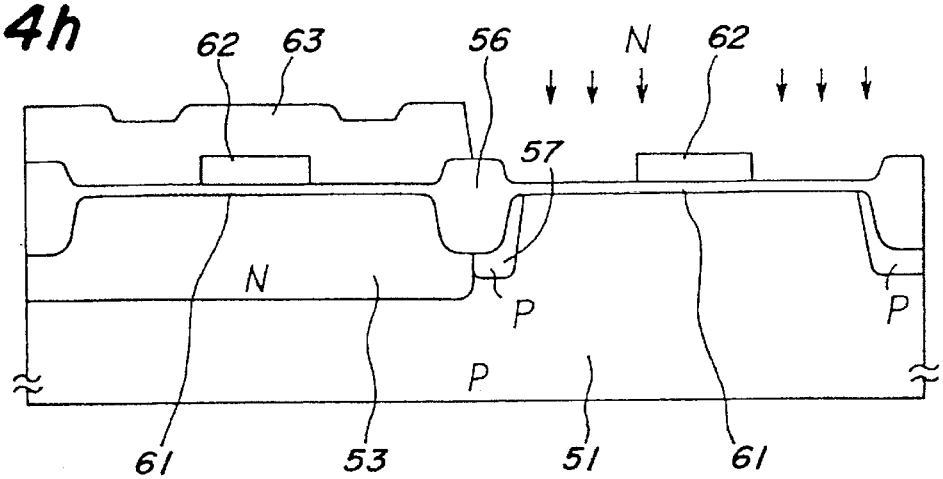
FIG_4h
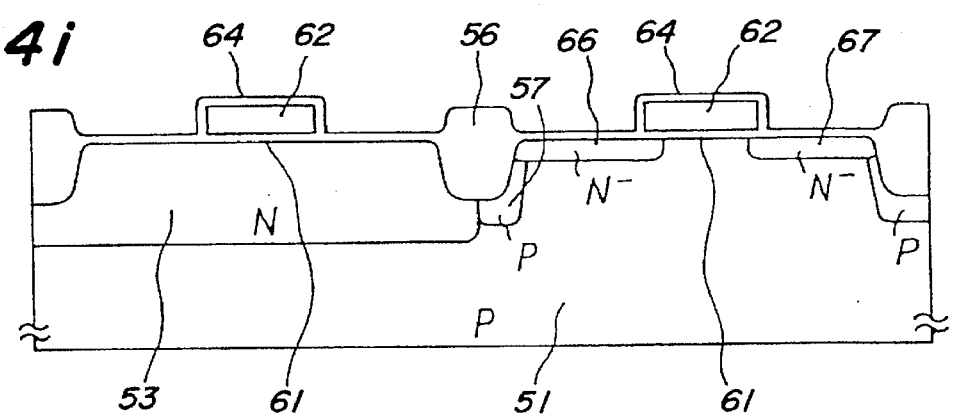
FIG_4i
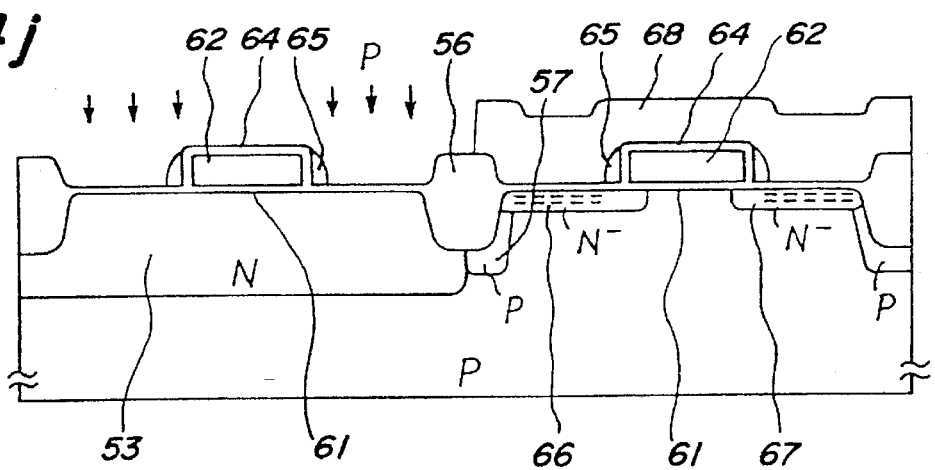
FIG_4j

FIG_4m
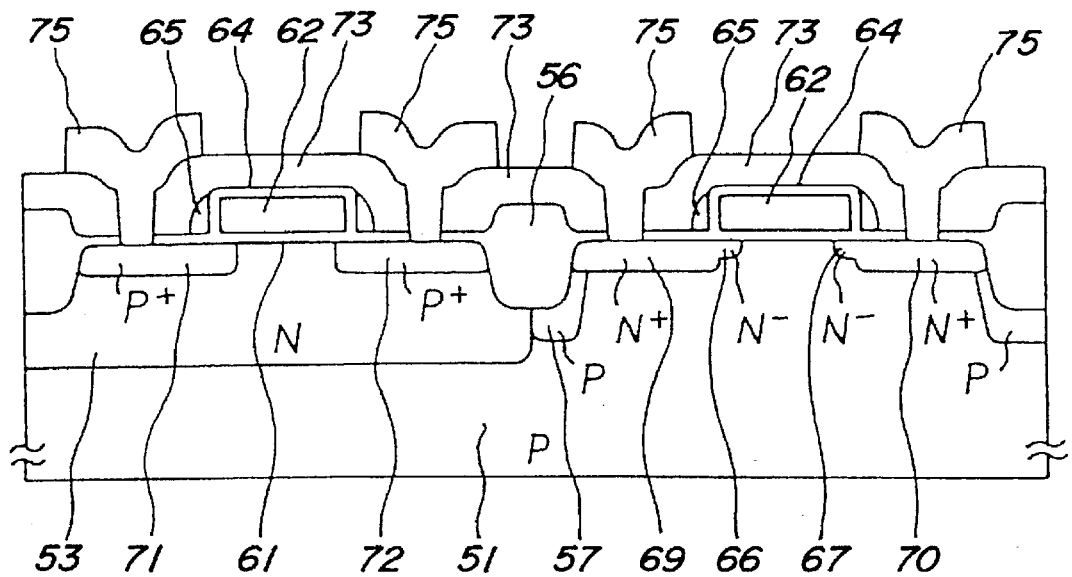
FIG_4n
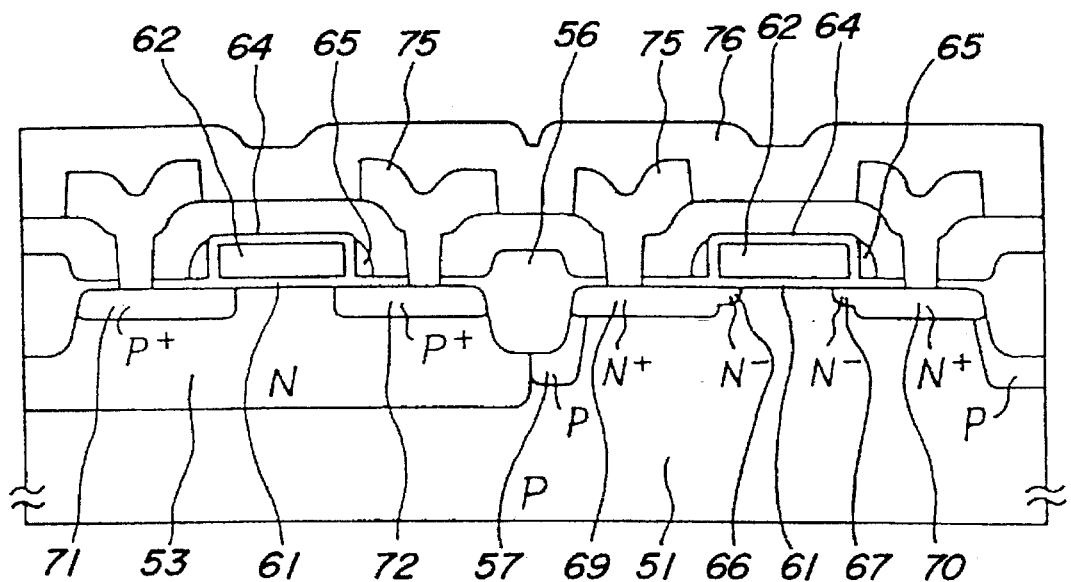

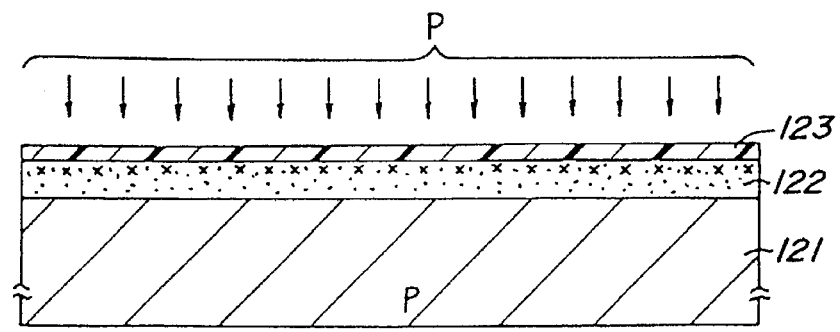
FIG_5a
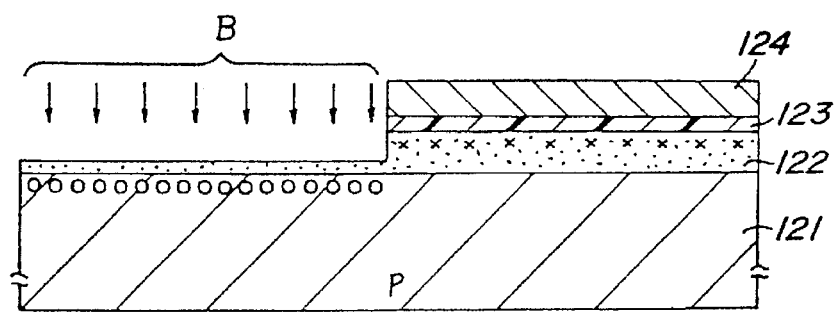
FIG_5b
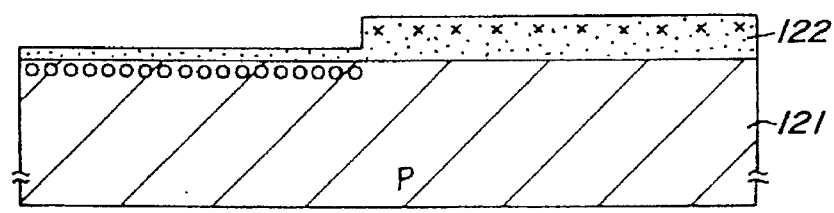
FIG_5c

FIG_5d
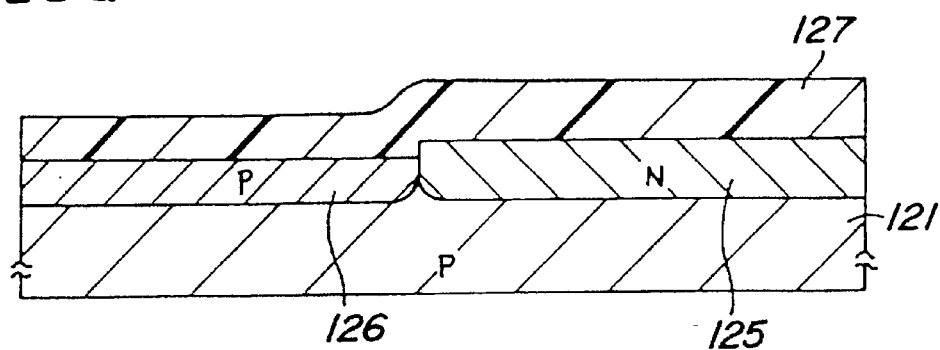
FIG_5e
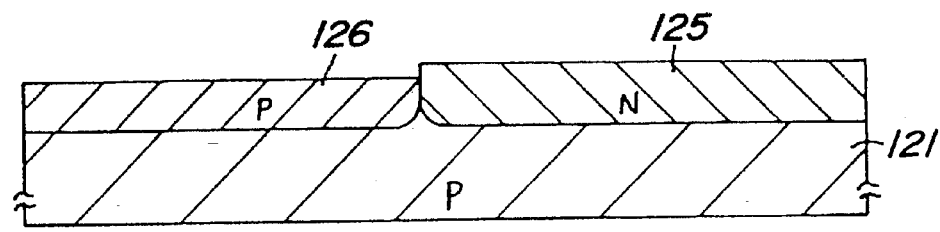

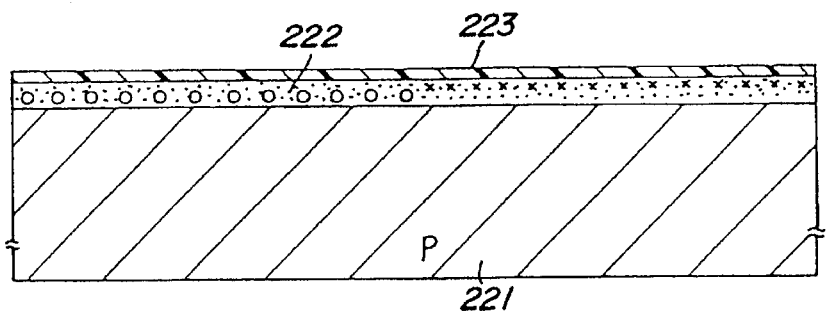
FIG_6a
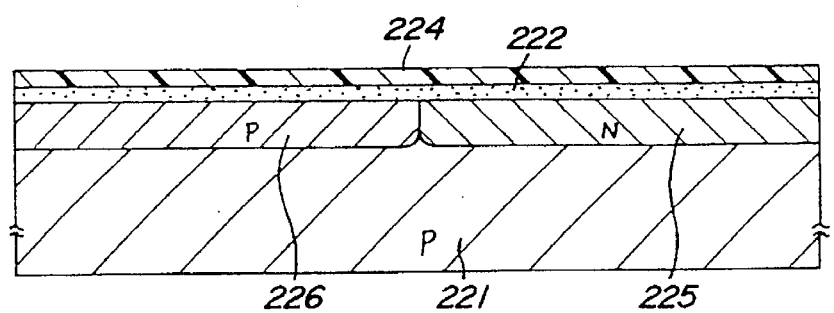
FIG_6b
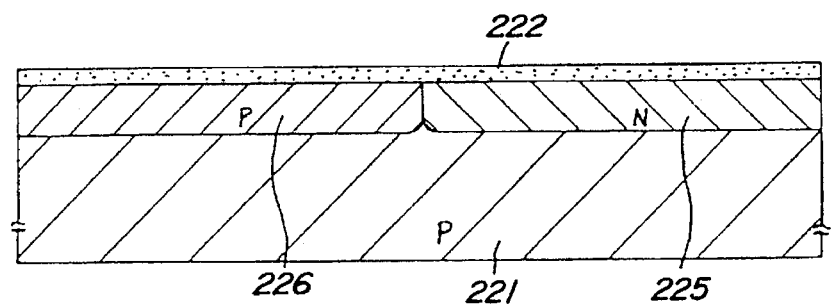
FIG_6c
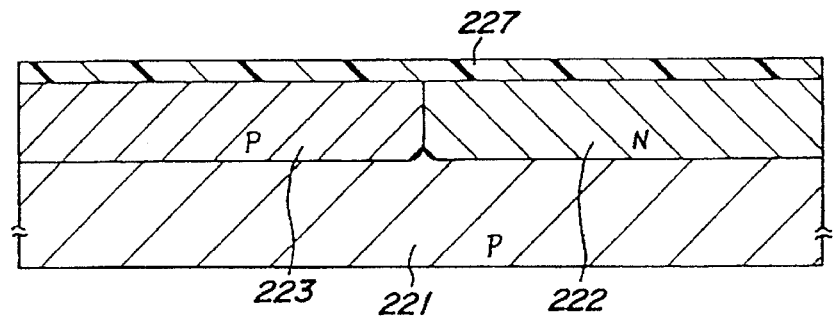
FIG_6d

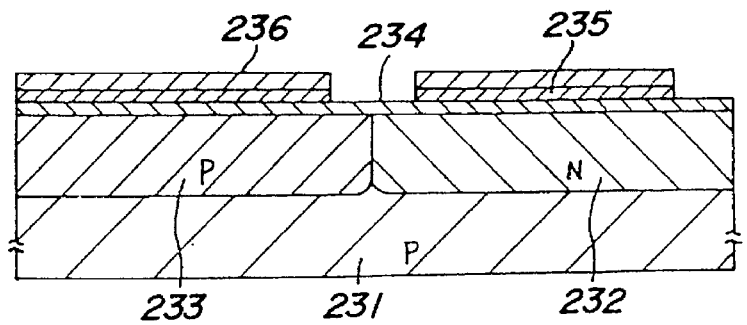
FIG_7a
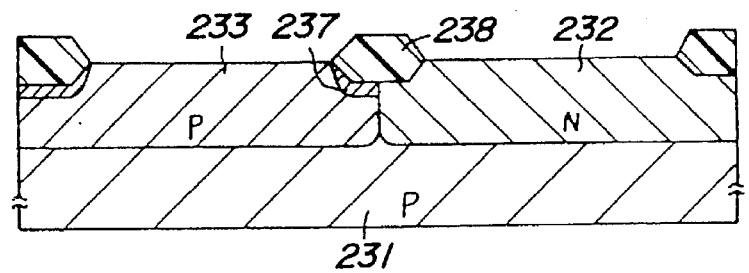
FIG_7b
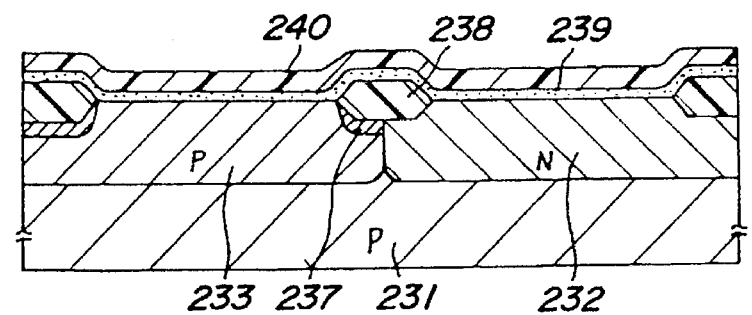
FIG_7c
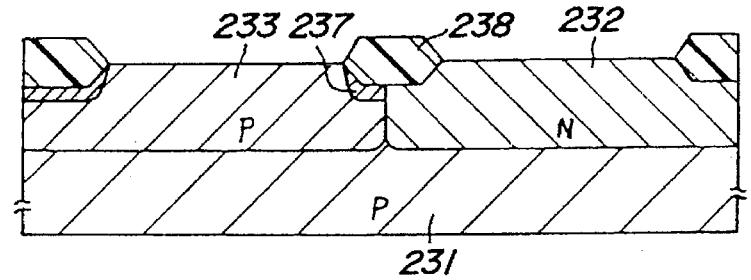
FIG_7d

5,627,099

METHOD OF MANUFACTURING SEMICONDUCTOR DEVICE

BACKGROUND OF THE INVENTION

1. Field of the Invention

The present invention relates to a method of manufacturing a semiconductor device.

2. Related Art Statements

A scale or circuit structure of integrated semiconductor devices has become larger and larger in order to satisfy a requirement of large capacity and large variety of performances. This results in a miniaturization of elements and a design rule has become smaller and smaller such as half microns and quarter microns. In order to reduce a size of elements, it is also required to miniaturize an isolation region for isolating adjacent elements from each other.

As a technique for isolating adjacent elements from each other, there has been developed a method of isolating the elements by dielectric material, and this method has been practiced by a local oxidation technique called LOCOS.

FIGS. 1a to 1e are schematic cross sectional views showing successive steps of a method of manufacturing C-MOS FET in accordance with a known LOCOS. At first, as shown in FIG. 1a, on a surface of a P-type silicon substrate 11 is formed a silicon oxide film 12 having a thickness of about 1500 Å. Then, after selectively implanting N type impurity ions, they are driven into the silicon substrate 11 by heating it at 1150° C. for about ten hours to form an N-type well 13 as illustrated in FIG. 1b. Then, a silicon oxide film 12a of a thickness of about 350 Å is formed, said silicon oxide film serving as a pad layer for a silicon nitride to be formed later.

Next, a silicon nitride film having a thickness of 1500 Å is uniformly formed on the silicon oxide film and then is patterned into a desired anti-oxidation film 14, and P-type impurity ions, i.e. channel stopper ions are implanted as depicted in FIG. 1c. These P-type impury ions serve to prevent the inversion of channel of an N-type FET. Thereafter, a thermal oxidation treatment is performed at a temperature of about 1000° C. to form locally field oxide films 12b having a thickness of about 6000 Å as shown in FIG. 1d. After removing the silicon oxide film 12a by etching, a gate oxide film 12c of a thickness of about 200 Å is newly formed. During the formation of the field oxide film 12b, channel stopper regions 15 are also formed.

Next, a poly silicon film having a thickness of about 4000 Å is uniformly deposited and a large amount of N-type impurity ions are doped therein by $PoCl_3$ at 900° C. Then, the poly silicon film is selectively patterned to form gate electrode 16 as illustrated in FIG. 1e. Next, a resist 17 is applied on a portion of the substrate above the N-type well 13 in which an P-type FET is to be formed, and N-type impurity ions are implanted into a portion of the substrate 11 at which an N-type FET is to be formed later as depicted in FIG. 1f.

After removing the resist 17, a silicon oxide film having a thickness of about 2000 Å is formed by CVD method, and an anisotropic etching is carried out to form side walls 18 on side surfaces of the gate electrodes 16 made of poly silicon as shown in FIG. 1g. By this process, low impurity density regions 19 and 20 of source and drain of N-type FET are formed.

Next, a portion of the substrate at which the N-type FET is to be formed is covered with a resist 21, P-type impurity ions are implanted at a high density for constructing source and drain of the P-type FET as shown in FIG. 1h.

After removing the resist 21, a region of the P-type FET is covered with a new resist, and N-type impurity ions are implanted at a high density in order to form highly doped regions for source and drain of the N-type FET. Then, implanted P-type and N-type impurity ions are driven into the substrate 11 to form highly doped source and drain regions 22 and 23 for N-type FET. At the same time, source and drain regions 24 and 25 of the P-type PET are formed. Thereafter, a passivation film 26 made of $CVD-SiO_2$ and BFSG (borophosphosilicate glass) is provided by deposition and then is reflowed by heating the substrate in an atmosphere of nitrogen at 900° C. as depicted in FIG. 1i.

Next, contact holes 27 are formed in the passivation film 26 as shown in FIG. 1j and a metal film having a thickness of about 1.0 μm is deposited and is patterned to form metal wiring 28 as illustrated in FIG. 1k. Finally, a plasma nitrogen film 29 having a thickness of about 1.0 μm is formed as a passivation film, and then an alloying process is carried out to manufacture C-MOS FETs as shown in FIG. 1e.

As stated above, in recently developed semiconductor devices, transistors are required to have very high performances, so that they are miniaturized and density is increased. At the same time, a diffusion depth has becomes shallower such as 0.1 to 0.2 μm. Further a gate width which relates to a switching speed has become narrower year after year and a size of a single transistor has become extremely small.

However, the above requirements could not be fully satisfied due to various reasons. One of these problems is a bird's beak which is produced during the selective oxidation for forming the field oxide film. The bird's beak is produced by a lateral diffusion of oxygen along the silicon oxide film which is formed between the silicon substrate and the silicon nitride film and serves as a pad or buffer for preventing the generation of crystal defects. Therefore, the bird's beak is related to a thickness of the buffer silicon oxide film and an oxidation temperature. In "Laterally Sealed LOCOS Isolation" in "JOURNAL OF THE ELECTROCHEMICAL SOCIETY", June 1987, pp.1475 to 1479, there is described a method of mitigating the generation of the bird's beak. Then, this method will be explained with reference to FIGS. 2a to 2c.

FIGS. 2a to 2c are schematic cross sectional views illustrating successive steps of the above mentioned known method of suppressing the generation of the bird's beak. On a silicon substrate 31 there are successively formed a buffer silicon oxide film 32, an anti-oxidation silicon nitride film 33 and a silicon oxide film 34. After etching these films selectively into a given pattern, a silicon nitride film 35 is formed over a whole surface as shown in FIG. 2a.

Next, a spacer 36 made of silicon nitride is formed on a side wall of these films 32, 33, 34 by effecting an anisotropic etching. Then, the silicon oxide film 34 within the spacer 36 is selectively removed by etching as illustrated in FIG. 2b.

Then, isolation regions 37 are formed by a local oxidation as depicted in FIG. 2c. In this case, the spacer 36 made of silicon nitride film is directly contacted with the bulk of the silicon substrate 31, and thus during the field oxidation, an oxygen introduction path is suppressed by the spacer 36. In this manner, the generation of the bird's beak can be mitigated by suitably designing the structure.

In the known method of preventing the generation of the bird's beak, the spacer 36 is directly contacted with the silicon substrate 31 in order to reduce the passage of the oxygen. However, expansion coefficients of the silicon substrate and spacer are different from each other, and thus there is produced a stress. This results in crystal defects in the silicon substrate after the local oxidation and a leak current between elements is liable to be increased. In a memory device such as S-RAM, a standby leak current is increased.

In the local oxidation disclosed in the above reference, in order to reduce the lateral passage of oxygen by suitably designing the construction, an assembly of $SiO_2$—$Si_3N_4$—$SiO_2$ films is etched into a desired pattern to expose a surface of the bulk of the silicon substrate 31 and the silicon nitride film 35 is deposited thereon as shown in FIG. 2a, and then the spacer 36 is formed by the anisotropic reactive ion etching.

The spacer 36 is formed on a side wall of the above mentioned assembly of $SiO_2$—$Si_3N_4$—$SiO_2$ films and is subjected to a stress. Further, the spacer 36 is directly contacted with the bulk of the silicon substrate 31. In this case, even a small damage due to the reactive ion etching is remained in the surface of the silicon substrate 31, OSF (Oxidation-induced Stacking Fault) is liable to occur during the local oxidation for forming the thick silicon oxide film 37 serving as the field oxidation.

It is possible to remove any etching damage during the reactive ion etching prior to the formation of the spacer 36, but in practice, it is rather difficult to remove all etching damages prior to the formation of the silicon nitride film 35. If the spacer 36 having a large stress is formed on the surface in which etching damages are remained, the damages are increased or enhanced during the local oxidation process, so that there might be produced a very large leak current between adjacent elements.

In order to reduce the power consumption of LSI, it is desired to form C-MOB PETs. In this case, in a surface of a silicon substrate, there are formed a P-type well and an N-type well side by side. These wells are often called twin wells. In such wells of low impurity density, when contamination substances are existent, troubles might occur during high temperature process, long time diffusion process and oxidation process. There are various kinds of contamination substances such as substances due to diffusion carrier gas, water and mist of spin drying, particles and organic substances such as resist remaining on a wafer surface.

In N-type well and P-type well, there might be produced etch pits due to Secco-etching, so that a leak current at a junction might be increased or a leak current via the field oxide film between adjacent elements might be increased.

In recent C-MOS devices, characteristics such as $BV_{ox}$, $Q_{BD}$ and ESD relating to a property of a gate oxide film are deteriorated as process trouble.

In order to solve the above mentioned problems, there has been proposed a gettering method.

FIGS. 3a to 3d are schematic cross sectional views showing successive steps of a known method of manufacturing the twin wells.

At first, on a rear surface of a silicon substrate 41 is formed a damage film 42 for collecting contamination substances as shown in FIG. 3a. The damage film 42 is formed at a time of manufacturing a silicon wafer. After forming a silicon oxide film 43 having a thickness of about 1000 Å on a front surface of the silicon substrate 41, a resist 44 is selectively formed as shown in FIG. 3b, and 31p+ N-type impurity ions are implanted into the silicon substrate 41 while the resist 44 is used as a mask. Then, the implanted impurity ions are driven into a bulk of the silicon substrate 41 to form an N-type well 45 as depicted in FIG. 3c. After forming a resist 46 above the N-type well 45, $^{11}B^+$ P-type impurity ions are implanted. Next, the thus implanted P-type impurity ions are driven into the bulk of the silicon substrate 41 to form a P-type well 47 and at the same time a silicon oxide film 48 is formed as shown in FIG. 3d.

As explained above, the damage film 42 is formed on the rear surface of silicon substrate 41 and a part of contamination substances contained in the silicon substrate are moved toward the damage film by performing the gettering treatment using $PoCl_3$. The remaining contamination substances within the silicon substrate 41 are moved into a boundary surface between the silicon substrate 41 and the silicon oxide film 43. Therefore, by removing the silicon oxide film 43 by performing an etching process using a fluoric acid, the contamination substances can be removed.

After that, a LOCOS field oxide film is formed at a boundary surface between the N-type well 45 and the P-type well 47, gate electrodes are formed via gate oxide films on these wells, lightly doped source and drain regions are formed by using the gate electrodes as masks, side walls are formed on sides of the gate electrodes and highly doped source and drain regions are formed by using the gate electrodes and side walls as masks.

In the known method illustrated in FIGS. 3a to 3d, a small amount of contamination substances collected in the boundary surface between the silicon substrate 41 and the silicon oxide film 43 can be removed only to a limited extent, so that its gettering function is not sufficient. In general, contamination substances within the silicon substrate 41 are liable to be collected in the damage film 42 formed on the rear surface of the silicon substrate 41. However, it is impossible to form such a damage film on the front surface of the silicon substrate, because then it is quite impossible to form a transistor structure at all.

In intrinsic getter, a damage layer is formed within a silicon substrate by implanting ions into the silicon substrate, and contamination substances are collected into this damage layer to improve the device performances. However, such an intrinsic getter could not remove the contamination substances sufficiently, and thus the surfaces of the wells 45 and 47 formed in the front surface of the silicon substrate 41 are liable to be subjected to the damage due to the contamination substances and a transistor leak current becomes large.

Moreover, in the known method of manufacturing the twin-well, a photomask process for forming the N-type well and a photomask process for forming the P-type well are carried out separately, so that these wells could not be formed in a self alignment manner and could not be formed to have a high accuracy in dimension. It is apparent that the number of processes is large and the manufacturing cost is liable to be high.

SUMMARY OF THE INVENTION

The present invention has for its object to provide a novel and useful method of manufacturing a semiconductor device, in which the formation of the bird's beak in the field oxide film can be effectively prevented, the increase in the leak current between adjacent elements due to,a stress can be mitigated and semiconductor devices can be manufactured simply at a large scale.

It is another object of the invention to provide a method of manufacturing a semiconductor device, in which contamination substance within a semiconductor substrate can be effectively removed to improve properties of elements.

It is still another object of the invention to provide a method of manufacturing a semiconductor device, in which contamination substances within a silicon substrate can be effectively removed and the twin-well structure can be simply and accurately formed by a smaller number of processes in a self alignment manner, so that the accuracy of dimensions can be improved.

According to a first aspect of the invention, a method of manufacturing a semiconductor device comprises the steps of:

preparing a semiconductor substrate having a surface;

forming a semiconductor film having a first thickness on said surface of the semiconductor substrate;

forming an anti-oxidation film on said semiconductor film;

patterning said anti-oxidation film;

forming a first silicon oxide film having a second thickness thicker than said first thickness in said surface of the silicon substrate by performing a thermal oxidation;

removing said anti-oxidation film;

converting said semiconductor film into a second oxide film by oxidation; and removing said second oxide film to expose a clean surface of the semiconductor substrate.

In the method according to the invention, the semiconductor film made of poly silicon or amorphous silicon is provided between the semiconductor substrate and the anti-oxidation film such as an silicon nitride film, and thus the lateral intrusion of oxygen can be prevented and the generation of the bird's beak can be effectively avoided.

Furthermore, the semiconductor film provided between the semiconductor substrate and the anti-oxidation film serves as a buffer during the oxidation treatment, so that no crystal defect is formed within the semiconductor substrate. That is, in the method according to the invention, in order to avoid a possible etching damage in the surface of the semiconductor substrate and a possible increase in the bird's beak due to the buffer oxide film, the anti-oxidation film is formed directly via the semiconductor film, so that the etching damage is not amplified within the bulk of the semiconductor substrate, but is stopped at the semiconductor film. This results in that the leak current is not further increased. The lateral diffusion of oxygen during the thermal oxidation treatment can be prevented by the semiconductor film and anti-oxidizing film, and thus the generation of the bird's beak can be effectively prevented. Moreover, after forming the thick field oxidation film for separating adjacent elements, the semiconductor film situating underneath the anti-oxidation film can be completely removed to expose a clean surface of the semiconductor substrate, and thus a gate oxide to be formed later will have a good quality.

According to a second aspect of the invention, a method of manufacturing a semiconductor device having complementary conduction type wells comprises the steps of:

preparing a semiconductor substrate having a surface;

forming a semiconductor film on said surface of the semiconuotor substrate;

introducing impurity ions of one conductivity type into said semiconductor film;

removing at least a part of the semiconductor film situating on a first region of the semiconductor substrate at which a well of the other conductivity type is to be formed, while a part of the semiconductor film situating on a second region of the semiconductor film at which a well of one conductivity type is to be formed;

introducing selectively impurity ions of the other conductivity type into said first region, while said semiconductor film is used as a mask;

heating said semiconductor substrate to drive said impurity ions of one conductivity type in said semiconductor film and said impurity ions in said first region of the semiconductor substrate into a bulk of said semiconductor substrate to form the well of one conductivity type and the well of the other conductivity type, during the heating process said semiconductor film being changed into an oxide film; and removing said oxide film to expose a clean surface of the semiconductor substrate.

According to a third aspect of the invention, a method of manufacturing a semiconductor device comprises the steps of:

preparing a semiconductor substrate having a surface;

forming a semiconductor film on said surface of the semiconductor substrate;

forming an insulating film on said semiconductor film;

performing a gettering treatment to collect contamination substances within the silicon substrate into said semiconductor film; and removing at least a part of said semiconductor film together with collected contamination substances.

In preferable embodiments of the method according to the second and third aspects of the invention, a surface portion of the semiconductor film is removed after performing the gettering treatment, a remaining semiconductor film is converted into the oxide film, and then the thus converted oxide film is removed to expose a clean surface of the semiconductor substrate.

When the semiconductor substrate is formed by a silicon substrate, said semiconductor film is preferably made of poly silicon or amorphous silicon.

In the methods according to the second and third aspects of the invention, the semiconductor film formed on the surface of the semiconductor surface has a gettering function which is comparable to that of the known damage layer, so that contamination substances can be effectively collected therein. Therefore, the contamination substances within the semiconductor substrate, particularly those near the surface of the semiconductor substrate which influence greatly the property of semiconductor elements can be effectively removed, and thus the element property can be improved. Further, the semiconductor film is converted into the oxide film during the drive-in process, so that the surface of the semiconductor substrate is free from damage. Particularly, after removing the semiconductor oxide film to expose the clean surface of the semiconductor substrate, a gate oxide film having an excellent property can be newly formed.

In particular, in the method according to the second aspect of the invention, in addition to the above mentioned function, it is possible to attain the following special function, That is, the impurity ions of the other conductivity type are implanted by using a mask which has been used in the step of removing at least a part of the semiconductor film situating on the region at which the well of the other conductivity type is to be formed, and therefore it is possible to manufacture the twin-well configuration accurately in a self alignment manner,

BRIEF DESCRIPTION OF THE DRAWINGS

FIGS. 1a to 1e are cross sectional views showing successive steps of a known method of manufacturing a semiconductor device;

FIGS. 2a to 2c are cross sections illustrating successive steps of another known method of manufacturing a semiconductor device;

FIGS. 3a to 3d are cross sectional views depicting successive steps of another known method;

FIGS. 5a to 5e are cross sectional views illustrating successive steps of a second embodiment of the method according to the invention;

FIGS. 6a to 6d are cross sectional views showing successive steps of a third embodiment of the method according to the invention; and FIGS. 7a to 7d are cross sectional views depicting successive steps of a fourth embodiment of the method according to the invention.

DESCRIPTION OF THE PREFERRED EMBODIMENTS

Figure 1A:
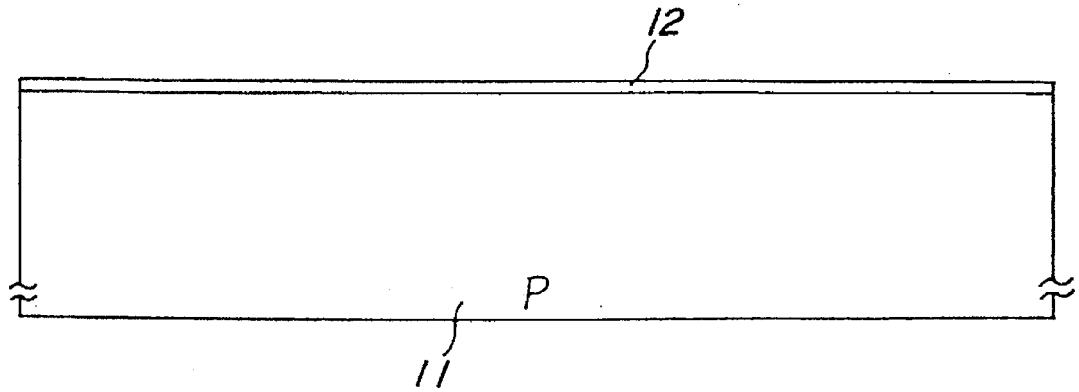
Figure 1B:
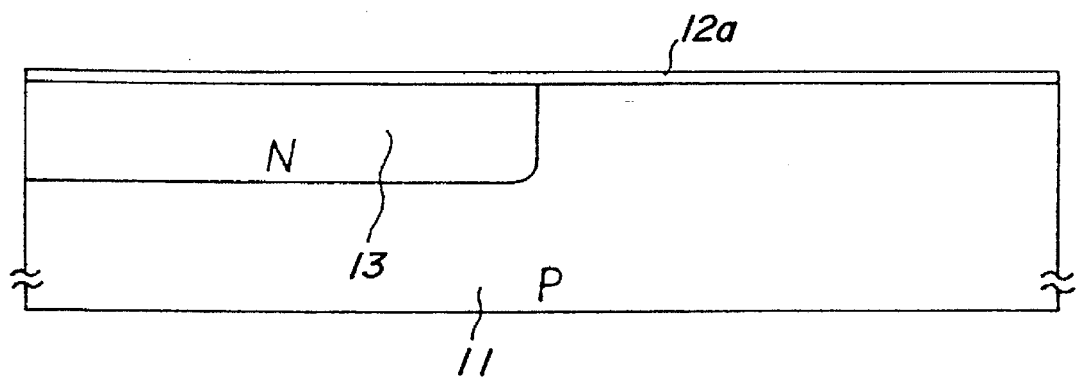
Figure 1C:
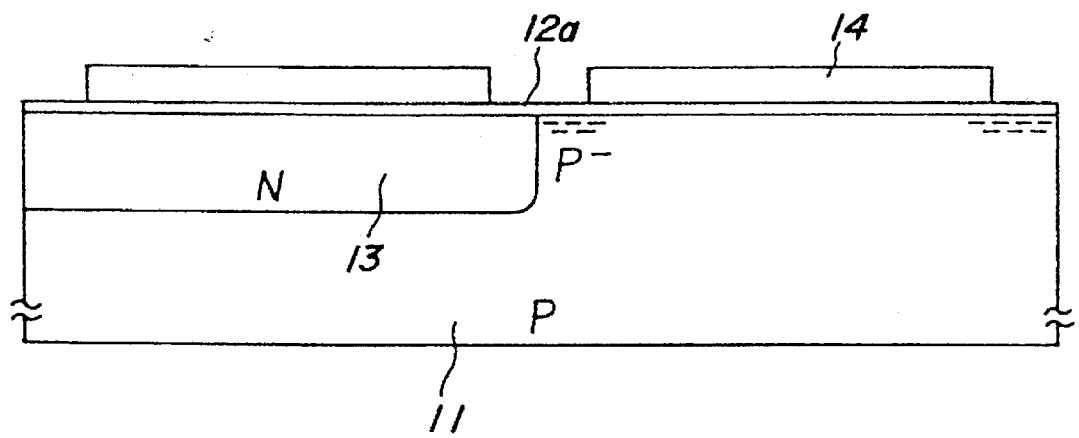

FIGS. 4a to 4n are cross sectional views showing successive steps of a first embodiment of the method of manufacturing a semiconductor device according to the invention. In the present embodiment, C-MOS FETs are to be formed, but it is apparent that the present invention is not limited to such an embodiment.

At first, as illustrated in FIG. 4a, on a surface of a P type silicon substrate 51 is formed a silicon oxide film 52 having a thickness of about 1000 Å. After that, an N type well 53 is formed as shown in FIG. 4b by selectively implanting N-type impurity ions. Then, the silicon oxide film 52 is removed, and a poly silicon film 54 having a thickness of 200 to 500 Å is formed as depicted in FIG. 4c.

Next, a silicon nitride film having a thickness of about 1000 Å is formed on the polysilicon film 54 and is patterned selectively to form anti-oxidation films 55 as shown in FIG. 4c. Then, P- ions are implanted into the silicon substrate 51 in order to prevent a field conversion for an N-channel transistor. The patterning of the anti-oxidation film 55 is carried out by a reactive ion etching and a resist pattern is also removed. During this reactive ion etching, the poly silicon film 54 having a thickness of 200 to 500 Å can effectively serve as a pad, so that the underlying silicon substrate 51 is free from etching damage.

It should be noted that a thickness of the poly silicon film 54 is not limited to 200 to 500 Å. In general, the generation of defects becomes smaller in accordance with an increase in a thickness of the poly silicon film. Furthermore, a thickness of the silicon nitride film 55 is not limited to 1000 Å, and a stress becomes smaller in accordance with a decrease in a thickness of the silicon nitride film. Thicknesses of these films 54 and 55 can be determined suitably by taking into account of a size of acceptable bird's beak and a wet etching process with HF for removing a poly silicon oxide film in a later process.

Figure 4D:
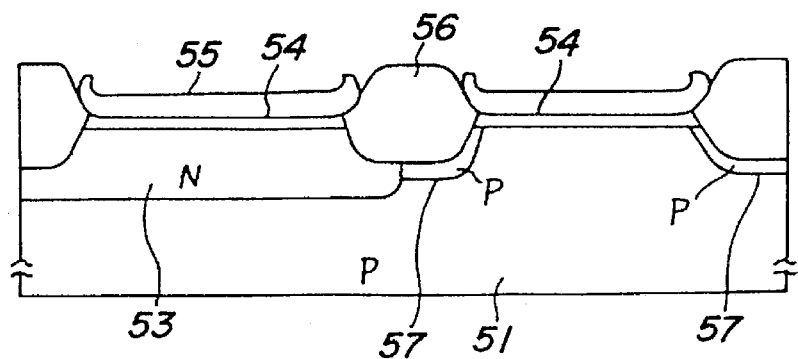
FIGS. 4a to 4n are cross sectional views representing successive steps of a first embodiment of the method of manufacturing a semiconductor device according to the invention.

Then, a thermal oxidation is performed to form field oxide films 56 having a thickness of about 6000 Å, said field oxide film serving as an element isolation region. This condition is shown in FIG. 4d. During the formation Of the thick field oxide film 56, the P-type impurity ions are driven into the silicon substrate 54 to form a F-type channel stopper region 57 for preventing the inversion of the channel.

Figure 4E:
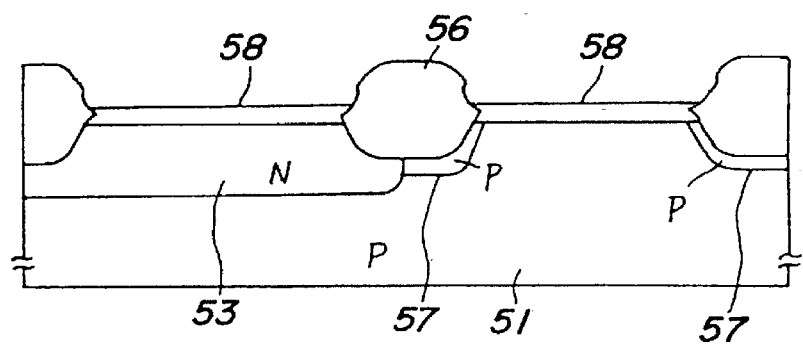
Figure 4F:
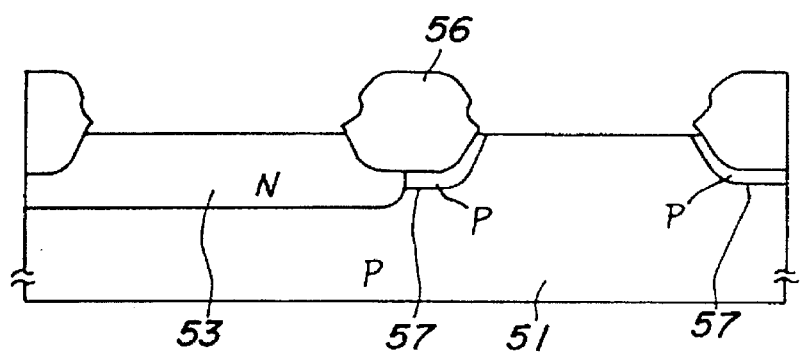

After that, the silicon nitride film 55 is selectively removed as shown in FIG. 4e by using phosphoric acid heated to, for instance 170° C. Then, a whole body is subjected to a thermal oxidation and the poly silicon film 54 is completely changed into a silicon oxide film 58 having a thickness of 500 to 1000 Å. After that, an etch back is carried out by using HF (10:1) and a clean surface of the silicon substrate 51 is exposed as illustrated in FIG. 4f. It should be noted that in addition to the clean surface of the silicon substrate 51, the field oxide film 56 is exposed. In this manner, the poly silicon film 54 can be completely removed.

The field oxide film 56 thus formed has no bird's beak or only a very small bird's beak and the etching damage does not remain in the surface of the silicon substrate 51, so that a leak current between adjacent elements is very small.

Figure 4G:
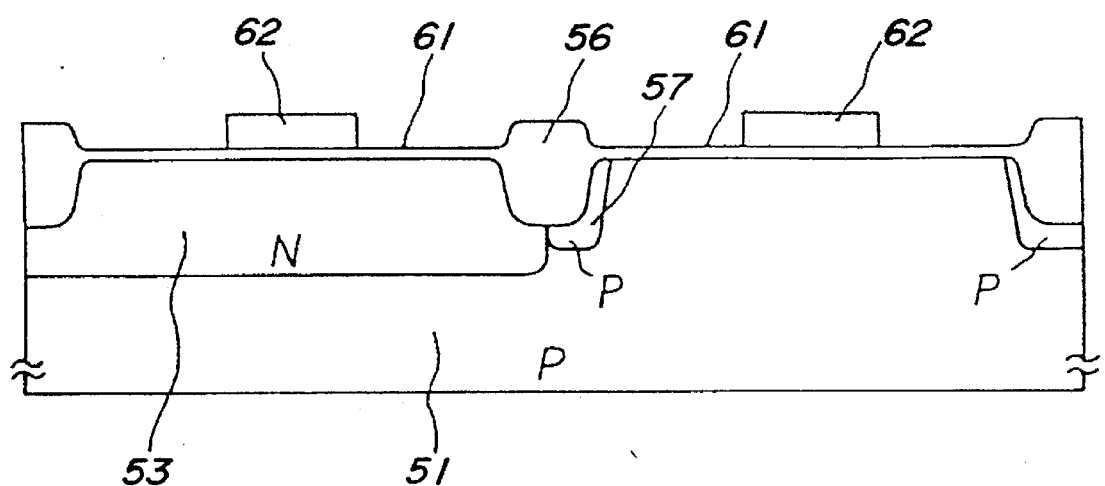

The following steps are substantially same as those of the known method and Will be explained briefly. As shown in FIG. 4g, a gate oxide film 61 having a thickness of about 200 Å is newly formed on the clear exposed surface of the silicon substrate 51 and a poly silicon film having a thickness of about 4000 Å is formed on the gate oxide film. After doping a large amount of N-type impurity ions into the poly silicon film by using $PoCl_3$ of 90° C., the poly silicon film is selectively patterned to form gate electrodes 62.

Next, as shown in FIG. 4h, a resist 63 is formed above the N-type well 53 in which P-type FET is to be formed and N-type impurity ions are implanted into the silicon substrate 51 at a portion where an N-type well is to be formed. Then, the resist 63 is removed and a silicon oxide film 64 having a thickness of about 2000 Å is formed by a CVD method as depicted in FIG. 4i. After that, an anisotropic etching is carried out to form a side wall 65 on a side of the gate electrode 62 made of poly silicon as illustrated in FIG. 4j. By this step, there are formed low impurity density regions 66 and 67 constituting parts of N-type source and drain of an N-type FET.

After covering the region in which N-type FET is to be formed with a resist 68, P-type impurity ions are implanted at a high density in order to form source and drain of P-type FET.

Figure 4K:
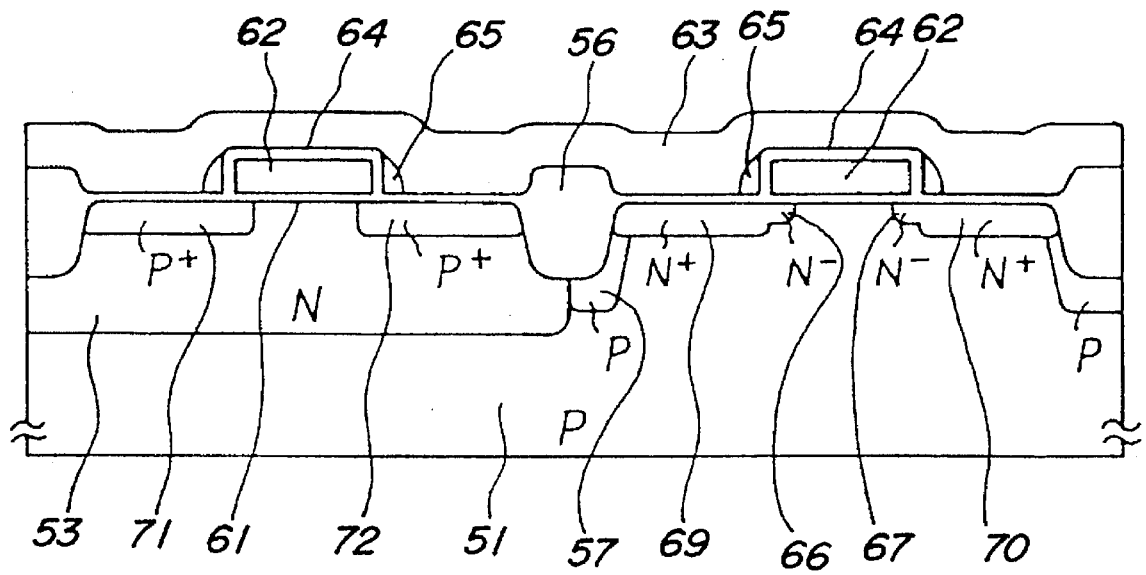
Figure 4L:
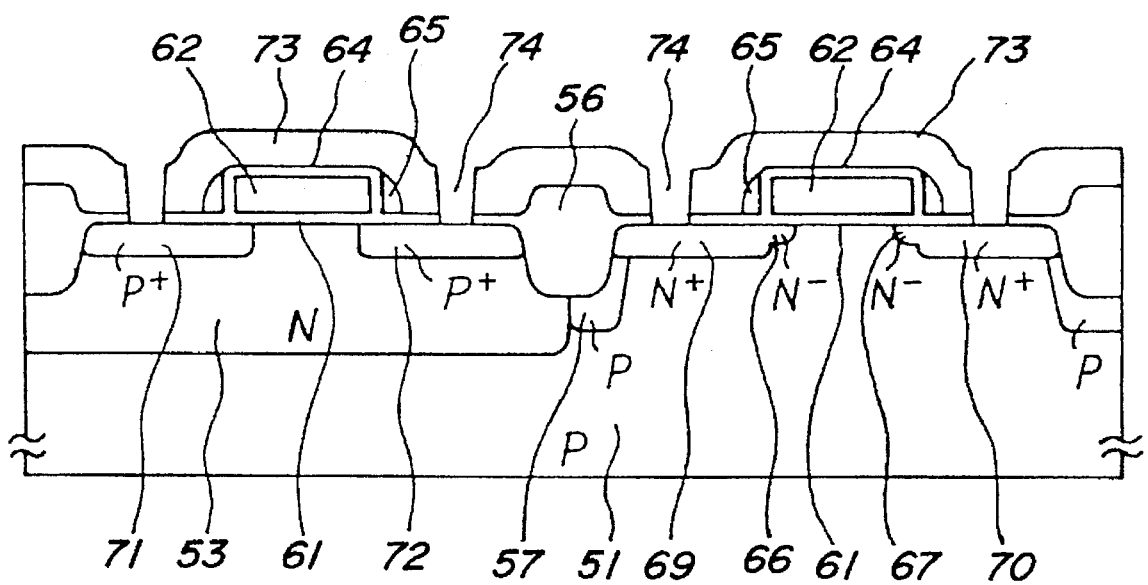

Next, the resist 68 is removed and the region at which P-type FET is to be formed is covered with a resist and N-type impurity ions are implanted at a higher density in order to form high impurity density portions of the source and drain of N-type PET. Then, the thus implanted impurity ions are driven into the silicon substrate 51 to form high impurity density source and drain regions 69 and 70 of N-type FET as well as source and drain 71 and 72 of P-type FET. Then, an insulating film 73 made of $CVD$-$SiO_2$ and BPSG is deposited, and then is reflowed in an atmosphere of nitrogen at 900° C. as depicted in FIG. 4k.

Then, contact holes 74 are formed in the insulating film 73 as depicted in FIG. 4e and a metal film having a thickness of about 1.0 μm is deposited on the insulating film. After that, the metal film is selectively etched into a given pattern to form a metal wiring 75 as illustrated in FIG. 4m. Finally, as shown in FIG. 4n, a plasma nitride film 76 is deposited, and then an alloy treatment is performed to manufacture C-MOS FETs.

In the above embodiment, the poly silicon film 54 is formed on the silicon substrate 51, but according to the invention, an amorphous silicon film may be deposited instead of the poly silicon film. Moreover, in the above embodiment, the poly silicon film is deposited directly on the silicon substrate, but according to the invention, a preprocess may be performed for the surface of the silicon substrate. For instance, this preprocess may be performed by using a fluoric acid. However, when the preprocess is carried out by using a hydrogen peroxide solution, a very thin silicon oxide film having a thickness less than 30 Å or a natural oxide film might be formed. In such a case, the generation of the bird's beak is not promoted without removing the oxide film by the fluoric acid preprocess. The thin oxide film serves to buffer a stress due to the LOCOS process using the silicon nitride film. Therefore, it is not always necessary to remove the thin oxide film on the silicon substrate prior to the formation of the poly silicon film.

In the above mentioned first embodiment of the method according to the invention, during the reactive ion etching process for patterning the silicon nitride film which serves as the anti-oxidation film, the semi-conductor film such as poly silicon film of an amorphous silicon film is existent, and thus etching damage hardly remains in the surface of the silicon substrate. Further, the semiconductor film is completely removed by the wet etching after being converted into the silicon oxide, so that the semiconductor substrate is free from contamination substances such as carbons and heavy metals which are produced during the reactive ion etching. Therefore, the leak current between adjacent elements can be suppressed to a very small value.

It should be noted that no silicon oxide film which allows the intrusion of oxygen serving as oxidizing agent is existent between the anti-oxidation film and the semiconductor film, and thus the lateral oxidation can be effectively prevented. In this manner, the generation of the bird's beak can be effectively suppressed. This results in that a thickness of the silicon nitride film can be reduced and thus defects due to a stress during the LOCOS process can be mitigated.

This also contributes to the reduction in the leak current.

In a known technique described in "Journal of the Electrochemical Society" June 1987, pp 1475 to 1479, an etching damage layer produced by the reactive ion etching could not be completely removed, and a silicon nitride spacer is formed directly on the surface of the silicon substrate having the etching damage remaining therein. Therefore, the etching damage is liable to be enhanced by a stress which is induced in the silicon nitride film by a heating treatment. In the method according to the invention, the silicon nitride film pattern is formed on the semiconductor substrate via the semiconductor film such as poly silicon film, and therefore the etching damage is prevented by the semiconductor film and a stress due to the silicon nitride film is buffered by the semiconductor film. In this manner, a slight etching damage within the bulk of the semiconductor substrate is removed or is limited to such an extent that the leak current between adjacent elements is not induced.

It has been well known in the art that the LOCOS isolation technique has been widely used in many ULSIs, but the problem of the bird's beak has limited the miniaturization of ULSIs. In order to mitigate this problem, there has been proposed a so-called poly buffer LOCOS isolation. However, ULSIs have required further miniaturization so that the poly buffer LOCOS isolation has to be further improved. That is to say, in the known poly buffer LOCOS isolation, there is produced a bird's beak longer than 0.3 µm, and thus this technique could not be applied to ULSIs having design rules of 0.35 µm and 0.25 µm.

The inventor of the instant application has conducted various tests and an alyses and has found that the above mentioned problem of the known poly buffer LOCOS isolation is caused by a fact that a stack of a silicon oxided film and a thin poly silicon film is provided between the silicon substrate and the silicon nitride film in order to buffer a stress. During the field oxidation process, oxygen is produced from the silicon oxide film beneath the silicon nitride film, so that there is produced a large bird's beak. The known poly buffer LOCOS isolation technique has another problem that after the field oxidation process, the silicon nitride film and thin poly silicon film are removed by etching or chemical wet etching, and thus there might be produced poly silicon residuals which might affect transistor characteristics.

In the above explained first embodiment of the method according to the invention, between the silicon substrate and the silicon nitride film there is provided only the poly silicon or amorphous silicon film and there is not provided the silicon oxide film serving as an oxygen source, so that the intrusion of oxygen can be effectively prevented and the bird's beak can be reduced smaller than 0.05 to 0.15 µm. Moreover, after the field oxidation process, the buffer poly silicon or amorphous silicon film can be simply removed by converting it into a silicon oxided film which can be simply removed by HF dipping. This results in that poly silicon residuals are not formed on the transistor region, and therefore transistor characteristics can be improved. In this manner, according to the invention it is possible to manufacture highly miniaturized ULSIs having excellent transistor characteristics at a very high yield on a large scale.

FIGS. 5a to 5e are cross sectional views showing successive steps of a second embodiment of the method according to the invention. Also in the present embodiment, a semiconductor device including C-MOS FETs is to be formed. On a surface of a p-type silicon substrate 121 is formed a poly silicon film 122 having a thickness of about 1000 to 2000 Å. Then, a silicon oxide film 123 having a thickness of about 100 Å is formed on the poly silicon film 122, and phosphorus ions, i.e. N-type impurity ions are implanted into the poly silicon film 122 as shown in FIG. 5a. An acceleration energy of phosphorus ions is set to, for instance 20 KeV. It should be noted that the silicon oxide film 123 serves as a buffer for the ion implantation into the poly silicon film 122, so that if the phosphorus ions may be implanted into the poly silicon film 122, the silicon oxide film 123 may be dispensed with. Further, any other insulating film may be used instead of the silicon oxide film.

Next, a resist is formed on the silicon oxide film 123 and a portion of the resin situating above a region in which a P-type well is to be formed is removed to form a resist pattern 124 which covers a part of the silicon substrate 121 in which a N-type well is to be formed. After forming the resist pattern 124 in the manner explained above, a part of the poly silicon film 122 situating above the region in which the P-type well is to be formed is removed by using the resist pattern 124 as a mask as shown in FIG. 5b to reduce a thickness of the poly silicon film. Then, boron ions, i.e. N-type impurity ions are implanted into the surface of the silicon substrate 121 via a thickness reduced portion of the poly silicon film 122. Since the implantation of boron ions for forming the P-type well is carried out by using the resist pattern 124 which is formed in order to form the N-type well, it is possible to form the N-type well and P-type well by a single photomask process in a self alignment manner. Therefore, the number of process steps can be reduced so that a manufacturing cost can be reduced and the twin-wells can be formed very precisely.

Next, as illustrated ion FIG. 5c, the resist pattern 124 and silicon oxide film 123 are removed, and when the wafer is subjected to a high temperature treatment at, for instance 1150° C. and the phosphorus ions implanted into the poly silicon film 122 and the boron ions implanted into the surface of the silicon substrate 121 are driven into a bulk of the silicon substrate 121 to form N-type well 125 and P-type well 126 as shown in FIG. 5d. During this high temperature process, the poly silicon film 122 is completely converted into a silicon oxide film 127.

In the present embodiment, during the ion drive-in process at a high temperature, contamination substances such as carbon and heavy metals within the silicon substrate 121 are collected into the poly silicon film 122. That is to say, the poly silicon film 122 effectively serves as the damage layer for the contamination substances. In this manner, damages in the surface of the N-type and P-type wells can be buffered.

Next, as depicted in FIG. 5e, the poly silicon film 127 is removed by a wet etching using a hydrofluoric acid solution to expose a clean surface of the silicon substrate 121. During this process, contamination substances collected in the silicon oxide film 127 are also removed. Then, a gate oxide film is formed on the clean surface of silicon substrate 121. It should be noted that because the surface of the silicon substrate 121 is free from damage, it is possible to form the gate oxide film having an excellent property. Following steps of manufacturing the C-MOS FETs are entirely same as those of the first embodiment and their explanation is dispensed with.

In the above explained second embodiment of the method according to the invention, after implanting the phosphorus ions into the poly silicon film 122, a part of the poly silicon film situating above the region in which the P-type well is to be formed is removed to reduce its thickness partially. However, according to the invention, said portion of the poly silicon film 122 may be fully removed. However, it is preferable not to remove said part of the poly silicon film 122 fully, because when said portion of the poly silicon film 122 is remained, the damage on the surface of the P-type well is also buffered. Furthermore, in the second embodiment, the semiconductor film is made of poly silicon, but it may be made of amorphous silicon.

FIGS. 6a to 6h are cross sectional views showing successive steps of a third embodiment of the method according to the invention. Also in the present embodiment, C-MOS FETs are to be formed.

At first, as illustrated in FIG. 6a, a poly silicon film 222 having a thickness of about 2000 Å is deposited on a surface of a P-type silicon substrate 221, and then a silicon oxide film 223 having a thickness of about 500 to 1000 Å is formed on a surface of the poly silicon film 222. After that, phosphorus ions, i.e. N-type impurity ions and boron ions, i.e. P-type impurity ions are selectively implanted via resist masks into the poly silicon film 222 at portions which correspond to N-type well and P-type well to be formed. It should be noted that the silicon oxide film 223 may be deleted or may be replaced by any other insulating film.

Next, a high temperature treatment is carried out at a temperature of, for instance 1150° C. to form a silicon oxide film 224 as illustrated in FIG. 6b. For instance, the silicon oxide film 224 having a thickness of about 2000 Å may be formed by heating the substrate at about 1000° C. During this high temperature treatment, the phosphorus ions and boron ions are driven into a bulk of the silicon substrate 221 to form N-type well 225 and P-type well 226.

Next, the gettering is performed within PoCl₃ at, for instance 1000° C. and contamination substances such as carbons and heavy metals within the N-type and P-type wells 225 and 226 are collected into the poly silicon film 222 Serving as a gettering film. In this case, the poly silicon film 222 can function as the damage layer for collecting contamination substances and they can be effectively collected within the poly silicon film and a boundary between the poly silicon film and the silicon oxide film 224.

After that, as shown in FIG. 6c, the silicon oxide film 224 is removed by etching and then a surface of the poly silicon film 222 is slightly etched. By this etching, the collected contamination substances are also removed. The silicon oxide film 224 is etched with fluoric acid and the poly silicon film 222 is etched by RCA treatment, e.g. SC₁ treatment using H₂O₂ and ammonia.

Next, the remaining poly silicon film 222 is completely oxidized by thermal oxidation and is converted into a silicon oxide film 227 having a thickness of about 2000 to 3000 Å as illustrated in FIG. 6d. Following steps are same as those of the known methods, so that its explanation is omitted.

In the present embodiment, the impurity ions for forming the N-type well 225 and P-type well 226 are implanted into the poly silicon film 222 functioning as the gettering layer, but according to the invention it is also possible to implant these ions into the silicon substrate 221. Further, the gettering film 222 may be made of amorphous silicon. Moreover, a thickness of the silicon oxide film 223 is not limited to a range of 500 to 1000 Å. In the present embodiment, after effecting the gettering, the remaining portion of the poly silicon film 222 is converted into the silicon oxide film 227 having a thickness of about 3000 Å, but according to the invention, the poly silicon film 222 may be removed completely by chemical etching or dry etching and then a CVD silicon oxide film may be newly deposited. Furthermore, after forming a thermal oxide film having a small thickness such as 500 Å, a CVD silicon oxide film having a thickness of about 5000 Å may be deposited on the thermal oxide film. In this case, it is preferable to form the poly silicon film 222 to have a small thickness such as 200 to 2000 Å.

FIGS. 7a to 7d are cross sectional views showing successive steps of a fourth embodiment of the method of manufacturing a semiconductor device according to the third aspect of the invention.

As shown in FIG. 7a, after forming N-type well 232 and P-type well 233 in a silicon substrate 231, a buffer poly silicon film 234 having a thickness of about 300 Å and a silicon nitride film 235 having a thickness of about 1600 Å are successively formed on the silicon substrate 231. Further, a resist 236 is formed on the silicon nitride film 235 and this silicon nitride film is etched into a desired pattern. Then, ions for forming a channel stopper for an N-type transistor are implanted and LOCOS process is carried out to form a channel stopper region 237 and field oxide film 238 as illustrated in FIG. 7b. Then, the silicon nitride film 235 and silicon oxide film 234 are removed.

In a known method, then a gate oxide film is formed after performing a scarifying oxidation, but according to the invention, as depicted in FIG. 7c, an N-doped poly silicon film 239 having a thickness of about 200 to 300 Å is formed directly on the N-type well 232 and P-type well 233 and a surface of this poly silicon film is oxidized to form a silicon oxide film having a thickness of about 100 Å and then a CVD-SiO₂ film 240 is deposited thereon. Then, annealing is conducted at a temperature of 900° C. to condense the silicon oxide films.

Next, the gettering is carried out with PoCl₃ at 900° to 1000° C., so that contamination substances such as carbon and heavy metals within the silicon substrate 231 are collected toward the poly silicon film 239. In this manner, the contamination substances are gathered in the poly silicon film 239 and a boundary between the poly silicon film 239 and the CVD-SiO₂ film 240.

Then, the CVD-SiO₂ film 240 and the silicon oxide film of 100 Å thickness are removed by etching with a fluoric acid. Further, the surface of the poly silicon film 239 is lightly etched to remove the contamination substances. This light etching is performed by RCA treatment, for instance $SC_1$ treatment using $H_2O_2$ and ammonia. Next, a remaining portion of the poly silicon film 239 is completely changed into a silicon oxide film having a thickness of 400 to 800 Å and the thus formed silicon oxide film is removed by etching with fluoric acid as shown in FIG. 7d.

In this manner, a clean surface of the silicon substrate 231 can be exposed and a gate oxide film of excellent property is newly formed thereon. Following steps are same as those of the known methods.

It should be noted that the method of the fourth embodiment of the present invention may be applied not only to the manufacture of C-MOS devices, but to the manufacture of other semiconductor devices. For instance, upon a formation of a base region of a bipolar transistor, a poly silicon film or amorphous silicon film may be directly formed on a surface of a silicon substrate and an insulating film such as silicon oxide film may be formed thereon. Also in this case, contamination substances may be effectively removed, so that it is possible to manufacture a bipolar transistor having an excellent property. Moreover, the present invention may be applied to the manufacture of a Shottocky barrier type semiconductor devices. In this. case, poly silicon film or amorphous silicon film is formed on n $N\text{-on-}N^+$ epitaxial film and a surface of the poly silicon film or amorphous silicon film is oxidized, and then the gettering is performed. In this manner, it is possible to manufacture Shottokey device having good property.

In the second, third and fourth embodiments of the method according to the invention, the twin wells can be manufactured simply and precisely in a self alignment manner. Further, the impurity ions are implanted into the semiconductor film such as poly silicon film and amorphous silicon film and are driven into the bulk of the semiconductor substrate, so that the surface of the semiconductor substrate can be free from damage and the gettering function for contamination substances can be performed effectively. Moreover, the silicon film is completely converted into the silicon oxide film during the drive-in process and the thus converted silicon oxide film can be removed simply, so that the clean surface of the semiconductor substrate can be exposed. Therefore, the property of the gate oxide film formed on the clean surface of the semiconductor substrate can be improved, and thus it is possible to form MOS devices having excellent properties such as $BV_{OX}$, $Q_{BD}$ and ESD. It has been experimentally confirmed by measuring a substrate current that the gate oxide film has a very small hot electron effect. In this manner, it is possible to obtain semiconductor devices having high reliability, small leak currents in the source and drain regions and long life time.

Furthermore, since the leak current between field oxide films formed by LOCOS can be suppressed, a stand-by leak current for S-RAM can be reduced and a die sort yield can be improved.

What is claimed is:

1. A method of manufacturing a semiconductor device, said method comprising:

preparing a semiconductor substrate having a surface;

forming a semiconductor film having a first thickness on said surface of the semiconductor substrate, said semiconductor film comprising a semiconductor material in direct contact with said surface of said semiconductor substrate;

forming an anti-oxidation film on said semiconductor film;

patterning said anti-oxidation film;

performing a thermal oxidation to form a first oxide film having a second thickness greater than said first thickness in said surface of the semiconductor substrate, said first oxide film serving as a field oxide film for isolating elements;

removing said anti-oxidation film;

forming a second oxide film by oxidizing said semiconductor film; and removing said second oxide film to expose a clean surface of the semiconductor substrate.

2. A method according to claim 1, wherein said semiconductor substrate is made of silicon, and said semiconductor material comprises poly silicon or amorphous silicon.

3. A method according to claim 2, wherein said anti-oxidation film is formed by forming a silicon nitride film on said semiconductor film and said silicon nitride film is patterned by a reactive ion etching during which said semiconductor film serves as a buffer for the reactive ion etching.

4. A method according to claim 2, wherein said second oxide film is removed by a wet etching.

* * * * *